Figure 1:
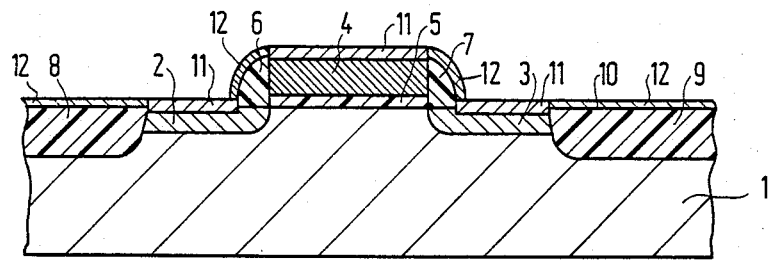

United States Patent [19]

Schmitz et al.

[11] Patent Number: 4,892,843
[45] Date of Patent: Jan. 9, 1990

[54] METHOD OF MANUFACTURING A SEMICONDUCTOR DEVICE

[75] Inventors: Johannes E. J. Schmitz; Antonius J. M. Van Dijk; Russell C. Ellwanger, all of Eindhoven, Netherlands

[73] Assignee: U.S. Philips Corporation, New York, N.Y.

[21] Appl. No.: 290,921

[22] Filed: Dec. 28, 1988

[30] Foreign Application Priority Data

Jan. 29, 1988 [NL] Netherlands .................. 8800221

[51] Int. Cl.$^4$ ............... H01L 21/00; H01L 21/02; H01L 21/31; H01L 21/60
[52] U.S. Cl. .................. 437/192; 437/200; 437/245; 437/189; 427/255.2; 427/124
[58] Field of Search ............. 437/192, 235, 245, 200; 427/53.1, 55, 248.1, 253, 99, 124, 255.1; 118/715, 733

[56] References Cited

U.S. PATENT DOCUMENTS 4,582,563 4/1986 Hazuki et al. .................. 156/643
4,629,635 12/1986 Brors .......................... 427/255.2

FOREIGN PATENT DOCUMENTS 0211318 2/1987 European Pat. Off. .

OTHER PUBLICATIONS

Schmitz et al., "Comparison of Step Coverage and Other Aspects of H$_2$/WF$_6$ and SiH$_4$/WF$_6$ Reduction Schemes Used in Blanket LPCVD of Tungsten", Procs. Tenth Int'l Conf. on CVD (Electrochem. Soc.), edited by Cullen et al., vol. 87-8, Oct. 1987, pp. 625-634.

Primary Examiner—Brian E. Hearn
Assistant Examiner—B. Everhart
Attorney, Agent, or Firm—Paul R. Miller

[57] ABSTRACT

The invention relates to a method of manufacturing a semiconductor device, in which a tungsten layer is provided on a surface of a substrate by reduction of tungsten hexafluoride with hydrogen.

According to the invention, the contact resistance of the tungsten with the substrate is considerably reduced by first providing a tungsten layer on the substrate by reduction of tungsten hexafluoride with silane.

14 Claims, 1 Drawing Sheet

METHOD OF MANUFACTURING A SEMICONDUCTOR DEVICE

The invention relates to a method of manufacturing a semiconductor device, in which a tungsten layer is provided on a surface of a substrate by reduction of tungsten hexafluoride with hydrogen.

A method of the kind mentioned in the opening paragraph is known, for example, from U.S. Pat. No. 4,612,257.

A tungsten layer provided by means of this method has a good step coverage of the surface of the substrate, but often gives rise to an attack of this surface, which results in a high contact resistance, while the rate of growth of a tungsten layer thus provided is not very high, for example 300 A/min.

The invention has inter alia for its object to reduce the attack of the substrate surface and to increase the rate of growth of the tungsten layer at least to a considerable extent.

The invention is based inter alia on the recognition of the fact that these objects can be achieved in that during part of the tungsten deposition another reduction agent for the tungsten hexafluoride is used.

The method mentioned in the opening paragraph is therefore characterized according to the invention in that, before the tungsten layer is provided by reduction of tungsten hexafluoride with hydrogen, a tungsten layer is provided by reduction of tungsten hexafluoride with silane from the gaseous phase, the mole fraction of silane being smaller in the supply to the gaseous phase than that of tungsten hexafluoride and hydrogen being absent.

It has been found that by means of the method according to the invention, due to the absence of hydrogen and the limitation of the silane concentration, attack of the substrate surface is avoided to a great extent and a low contact resistance is obtained. This is possibly based on the fact that the substrate is attacked to a smaller extent by fluorine or fluorine compounds.

Preferably, the tungsten layer is provided on silicon, aluminium or titanium-tungsten.

The rate of growth of the tungsten layer in the case of reduction with silane is also much higher than that in the case of reduction with hydrogen and amounts, for example, to 1500 A/min.

In general, tungsten layers grown solely by reduction of tungsten hexafluoride with silane does not exhibit a good step coverage. However, this is not the case in the method according to the invention, in which silane as reduction agent for tungsten hexafluoride is replaced by hydrogen.

The instant at which, when providing the tungsten layer, silane is replaced as reduction agent by hydrogen, depends, for example, upon the dimensions of a step or opening to be covered. A person skilled in the art can readily determine such an instant.

Preferably, the tungsten layers are provided at a temperature below 450° C. This is favourable for the step coverage in the reduction of tungsten hexafluoride with hydrogen.

Figure 2:
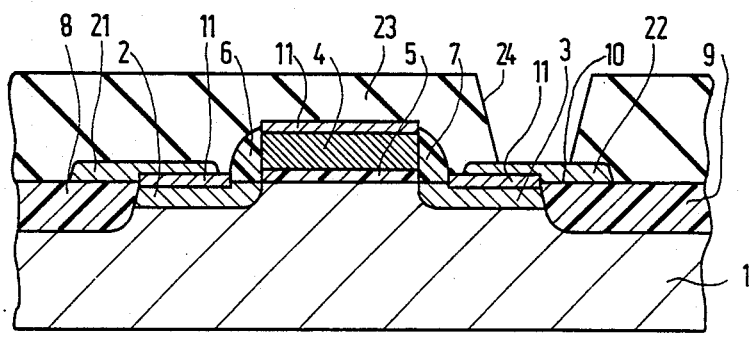
Figure 3:
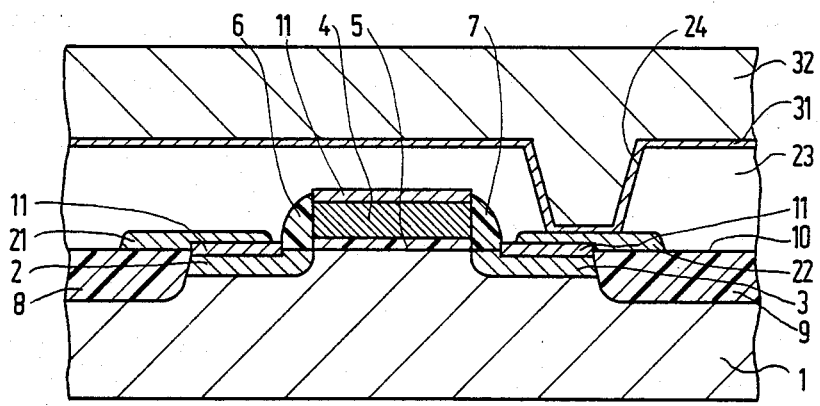

The invention will now be described with reference to an embodiment and the accompanying drawing. In the drawing:

FIGS. 1 to 3 show diagrammatically and in sectional view a part of a semiconductor device at successive stages of manufacture by means of the method according to the invention.

For example, at a stage of manufacture of a semiconductor device a structure of the kind shown in FIG. 1 is obtained. In this Figure, a silicon semiconductor body 1 with source and drain regions 2 and 3, a gate electrode 4 of polysilicon, gate isolation 5, silicon oxide regions 6 and 7 and silicon oxide regions 8 and 9 sunken into the semiconductor body are shown. By way of example, the drain region 3 will be provided with a connection by means of the method according to the invention. In a usual manner, B 200 A thick titanium is provided over the whole surface 10 of the semiconductor device. During a heat treatment in a nitrogen atmosphere, the titanium will react at the area at which it is present on silicon, i.e. on the source and drain regions 2 and 3 and the gate electrode 4, with silicon to form titanium disilicide 11, while at the area at which it is present on the oxide it will react to form titanium nitride 12. Subsequently, the titanium nitride 12 is etched selectively with respect to the titanium disilicide 11.

Source and drain regions 2 and 3 are now provided in a usual manner with 0.1 μm thick titanium-tungsten layers 21 and 22 (tungsten containing about 15% of titanium) (cf. FIG. 2) and are covered by an about 0.8 μm thick silicon oxide layer 23. The titanium-tungsten layer 21 is through-connected, for example, elsewhere, while an opening 24 having a diameter of about 1 μm is provided above the titanium-tungsten layer 22 in the layer 23. A 0.1 μm thick layer 31 of titanium-tungsten or aluminium is provided over the layer 23 and in the opening 24 (FIG. 3). A tungsten layer 32 is provided over the layer 31. For this purpose, the semiconductor device is placed on a monel holder in a reactor (not shown). This monel holder is cleaned by and and is provided in the reactor with a 0.6 μm thick tungsten silicide layer.

The tungsten layer 32 is provided by first carrying out in the reactor a reduction of tungsten hexafluoride with silane in the gaseous phase at 430° C., it being ensured that the mole fraction of silane is smaller in the supply to the gaseous phase that that of tungsten hexafluoride and that hydrogen is absent. In this case, a layer of 0.3 μm is grown in about 2 minutes. Subsequently, silane is replaced by hydrogen also at 430° C. and a layer of 0.6 μm is grown in about 20 minutes. The two last-mentioned layers together constitute the tungsten layer 32. As compared with known methods of providing a tungsten layer, the method according to the invention is carried out much more rapidly, while the step coverage is good and the contact resistance with the layer on which deposition takes place is also low. In a usual manner, the semiconductor device can further be finished.

The invention is not limited to the embodiment described. The tungsten layer may be provided, for example, directly on silicon.

In general, the method according to the invention is particularly suitable to provide tungsten layers in openings having a diameter which is smaller than 1.2 mm and a depth which is larger than 0.3 μm. For example, openings of a diameter of about 1 μm and a depth of about 0.8 μm may be formed.

It will be clear to those skilled in the art that the invention described herein provides the possibility of variations and modifications other than are specifically described herein without departing from the scope of the invention.

What is claimed is:

1. A method of manufacturing a semiconductor device comprising the steps of first forming a first tungsten layer on a substrate by reducing tungsten hexafluoride with silane in the gaseous phase and in the absence of a separate supply of hydrogen gas, said silane having a mole fraction smaller in the supply to the gaseous phase than a mole fraction of said tungsten hexafluoride, and thereafter forming a further tungsten layer over said first tungsten layer by reducing tungsten hexafluoride with only hydrogen gas.

2. A method according to claim 1, wherein said first tungsten layer is formed to a first thickness of 0.3 $\mu$m, and said further tungsten layer is formed to a second thickness of 0.6 $\mu$m.

3. A method according to claim 2, wherein said first tungsten layer and said further tungsten layer are both formed at a temperature below 450° C.

4. A method according to claim 3, wherein a silicon oxide layer is formed on said substrate, a plurality of openings are formed in said silicon oxide layer, said openings having a diameter smaller than 1.2 $\mu$m, said silicon oxide layer having a thickness larger than 0.3 $\mu$m, and said first tungsten layer and said further tungsten layer are formed in said openings.

5. A method according to claim 4, wherein said diameter is about 1 $\mu$m, and said thickness is about 0.8 $\mu$m.

6. A method according to claim 3, wherein said first tungsten layer and said further tungsten layer are formed on one of silicon, aluminum, or titanium-tungsten.

7. A method according to claim 1, wherein said first tungsten layer and said further tungsten layer are both formed at a temperature below 450° C.

8. A method according to claim 2, wherein a silicon oxide layer is formed on said substrate, a plurality of openings are formed in said silicon oxide layer, said openings having a diameter smaller than 1.2 $\mu$m, said silicon oxide layer having a thickness larger than 0.3 $\mu$m, and said first tungsten layer and said further tungsten layer are formed in said openings.

9. A method according to claim 8, wherein said diameter is about 1 $\mu$m, and said thickness is about 0.8 $\mu$m.

10. A method according to claim 2, wherein said first tungsten layer and said further tungsten layer are formed on one of silicon, aluminum, or titanium-tungsten.

11. A method according to claim 1, wherein a silicon oxide layer is formed on said substrate, a plurality of openings are formed in said silicon oxide layer, said openings having a diameter smaller than 1.2 $\mu$m, said silicon oxide layer having a thickness larger than 0.3 $\mu$m, and said first tungsten layer and said further tungsten layer are formed in said openings.

12. A method according to claim 11, wherein said diameter is about 1 $\mu$m, and said thickness is about 0.8 $\mu$m.

13. A method according to claim 11, wherein said first tungsten layer and said further tungsten layer are formed on one of silicon, aluminum, or titanium-tungten.

14. A method according to claim 1, wherein said first tungsten layer and said further tungsten layer are formed on one of silicon, aluminum, or titanium-tungsten.

* * * * *